(12) United States Patent
Krummacher et al.

(10) Patent No.: US 7,554,257 B2
(45) Date of Patent: Jun. 30, 2009

(54) METHOD TO GENERATE HIGH EFFICIENT DEVICES WHICH EMIT HIGH QUALITY LIGHT FOR ILLUMINATION

(75) Inventors: Benjamin C. Krummacher, Sunnyvale, CA (US); Mathew Mathai, Santa Clara, CA (US); Vi-En Choong, San Jose, CA (US); Stelios A. Choulis, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 516 days.

(21) Appl. No.: 11/159,557

(22) Filed: Jun. 22, 2005

(65) Prior Publication Data
US 2006/0197437 A1 Sep. 7, 2006

Related U.S. Application Data

(60) Provisional application No. 60/657,797, filed on Mar. 2, 2005.

(51) Int. Cl.
*H01J 1/62* (2006.01)
*H01J 63/04* (2006.01)

(52) U.S. Cl. .......................... 313/501; 313/498; 313/504; 313/506; 313/512

(58) Field of Classification Search ................. 313/498, 313/501–504, 506, 512
See application file for complete search history.

(56) References Cited

U.S. PATENT DOCUMENTS

2002/0030444 A1* 3/2002 Muller-Mach et al. ...... 313/512
2002/0197511 A1* 12/2002 D'Andrade et al. ......... 428/690
2006/0145599 A1* 7/2006 Stegamat et al. ............ 313/504

OTHER PUBLICATIONS

Anil R. Duggal; J. J. Shiang; Christian M. Heller and Donald F. Foust; Organic light-emitting devices for illumination quality white light; Applied Physics Letters vol. 80, No. 19; pp. 3470-3472; May 13, 2002.

* cited by examiner

*Primary Examiner*—Joseph L Williams
*Assistant Examiner*—Kevin Quarterman
(74) *Attorney, Agent, or Firm*—Cohen Pontani Lieberman & Pavane LLP

(57) ABSTRACT

An electroluminescent apparatus includes an OLED device emitting light in the blue and green spectrums, and at least one down conversion layer. The down conversion layer absorbs at least part of the green spectrum light and emits light in at least one of the orange spectra and red spectra.

45 Claims, 9 Drawing Sheets

US 7,554,257 B2

METHOD TO GENERATE HIGH EFFICIENT DEVICES WHICH EMIT HIGH QUALITY LIGHT FOR ILLUMINATION

CROSS-REFERENCE TO RELATED APPLICATIONS

This application claims priority from a provisional application entitled "Novel method to generate high efficient devices which emit high quality light for illumination," filed on Mar. 2, 2005, assigned Ser. No. 60/657,797.

GOVERNMENT RIGHTS

This invention was made with Government support under Contract No. DE-FC26-04NT41947 awarded by the Department of Energy. The Government may have certain rights in the invention.

BACKGROUND

1. Field of the Invention

This invention relates generally to the art of thin film device processing and fabrication. More specifically, the invention relates to the structure of Organic Light Emitting Diode devices and displays.

2. Related Art

In OLED (Organic Light Emitting Diode) technology there are four main approaches to generate white light for illumination: A single white stack (A), a vertical RGB stack (B), a horizontal RGB stack (C) and a blue stack combined with a phosphor (D). In FIG. 1, the advantages and disadvantages of these approaches are given. The spectral output of a single white stack (approach A) cannot be tuned very easily. The basic disadvantage of approach B is a lower efficiency due to electron trapping caused by the red organic emitter. Approach C is tunable and is expensive and difficult to manufacture. The shortcoming of approach D is the blue emitter, which usually offers lower quantum efficiency as well as reliability compared to a green emitter. Thus, there is a need for an efficient and tunable device structure to generate white light.

DETAILED DESCRIPTION OF THE INVENTION

Figure 1:
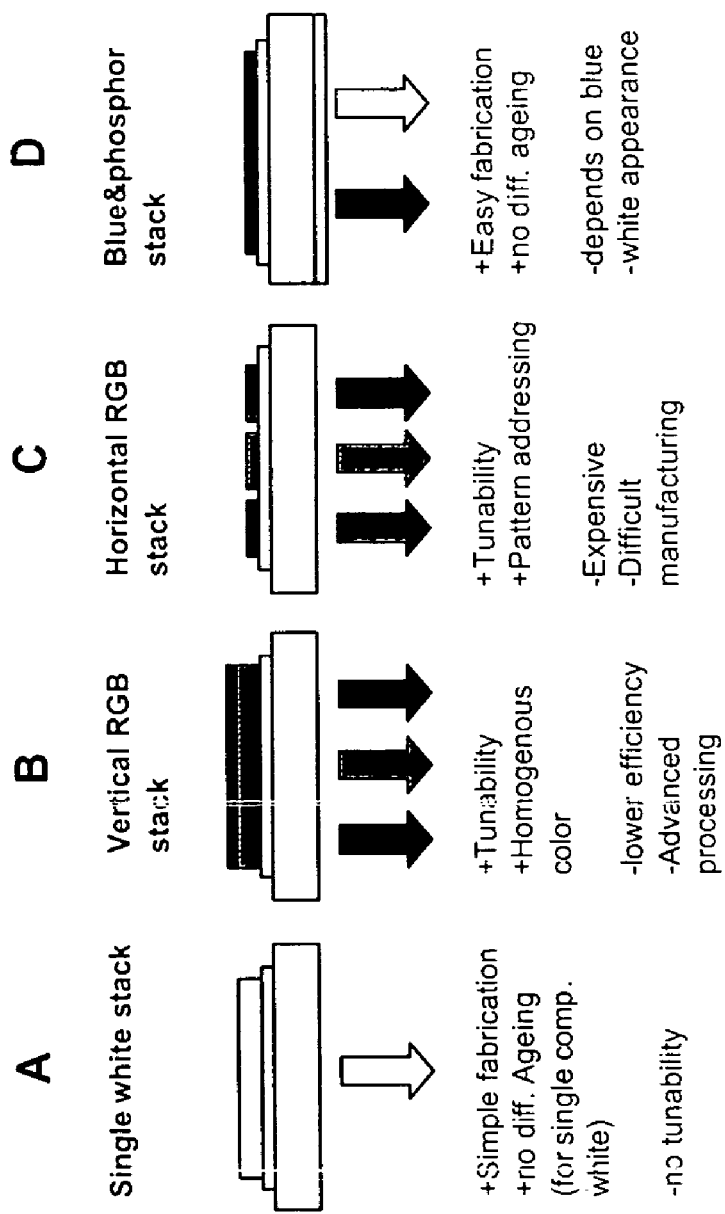
FIG. 1 illustrates the advantages and disadvantages of various lighting approaches.

In this invention, a novel approach is disclosed, which eliminates the disadvantages of approaches (B) and (D) discussed above and shown in FIG. 1 but keeps their advantages. In at least one embodiment, an electroluminescent apparatus is described which comprises of a bluish green OLED device coated with at least one down conversion layer. The down conversion layer absorbs a part of the green light from the OLED device and emits one ore more of orange, red, and/or yellow light. The resulting apparatus can provide a combined output spectrum that is white or nearly white. The advantages of such an apparatus are:

(1) Since the apparatus is based on a bluish green OLED, it offers a higher quantum efficiency than a blue OLED.

(2) There is no red light emitting component, which might lead to electron trapping, in the active electroluminescent part of the OLED device (and thus a low operating voltage of the apparatus can be achieved).

(3) The apparatus makes use of high efficiencies that are obtainable for green, and using that to provide the red through down conversion. The minimum amount of blue that is needed is provided separately to obtain high color rendering index.

(4) Fabrication of the apparatus is much easier with printing as only two materials need to be printed as opposed to RGB printing.

(5) Fabrication is also easier since only two (blue and green) rather than three emitting layers are required.

The various embodiments of the invention enable a highly efficient apparatus, which offers a high color rendering index such as white light. The various embodiments of the invention can be applied to all fields of lighting.

In at least one embodiment, the apparatus consists of a bluish-green emitting OLED device coated with one or more down conversion layers. The down conversion layer(s) comprise of one or more light converting materials or of one or more transparent matrices, in which one or more light converting materials are solved or embedded. Other methods of encompassing the light source with the down conversion material can also be implemented, such as dissolving or embedding the light converting materials in a transparent device housing, or using down conversion materials in liquid or gas phases.

Figure 2:
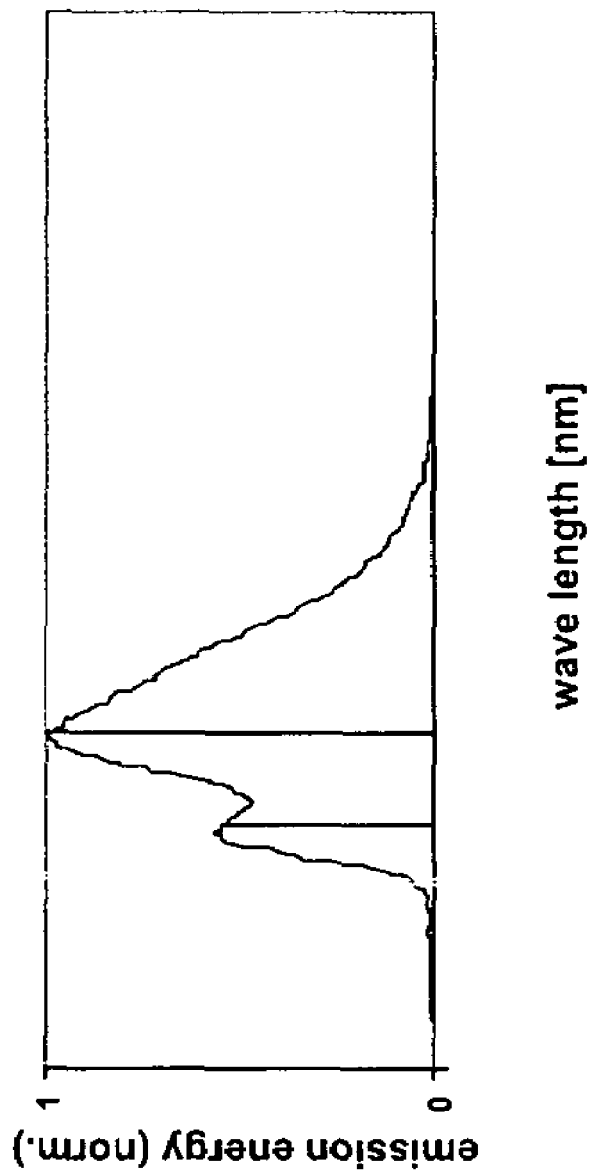
FIG. 2 shows an exemplary spectrum of a bluish-green light source utilized in one or more embodiments of the invention.

FIG. 2 shows an exemplary spectrum of a bluish-green light source utilized in one or more embodiments of the invention. A bluish-green light source or OLED is one component of the invention. In accordance with the invention, a down conversion layer or a combination of down conversion layers that absorbs light in the green range and emits in the orange or red range is combined a bluish-green light source similar to that shown in FIG. 2. The choice of the light converting materials used in the down conversion layer(s) depends upon the desired output spectrum of the device. In accordance with the invention, such down conversion layers, used in conjunction with a bluish-green light source such as that shown in FIG. 2, results in an electroluminescent device that offers good color rendering (a high color rendering index).

EXAMPLE

Figure 3:
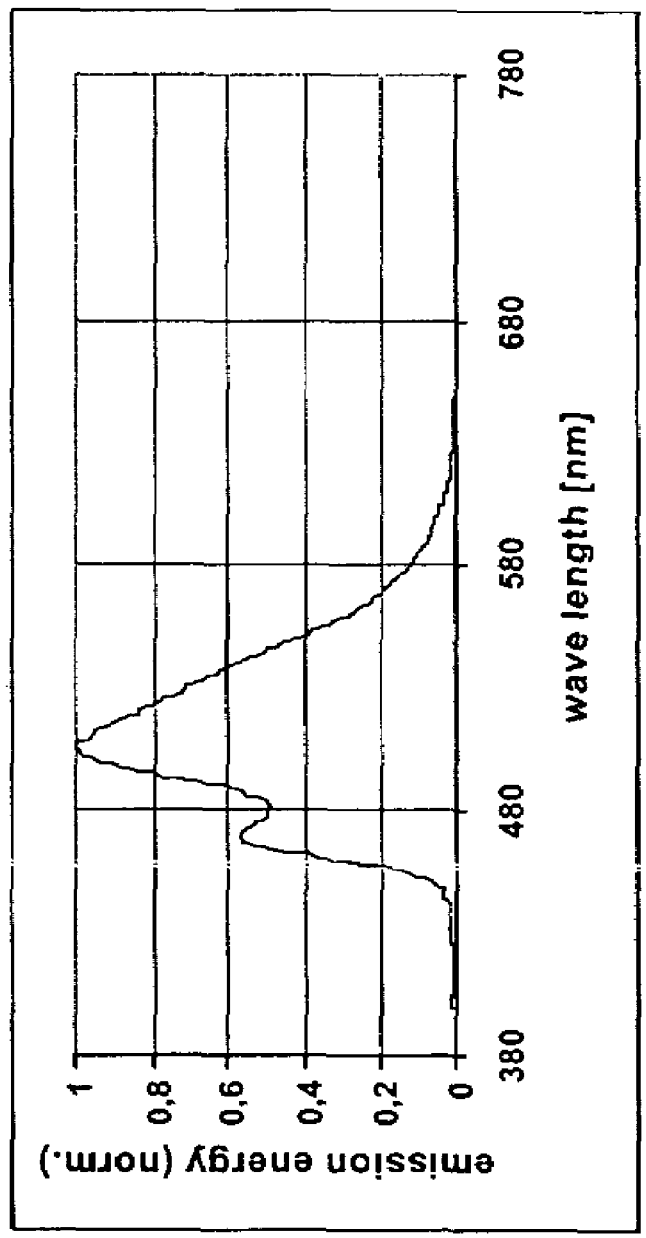
FIG. 3 illustrates a preferred emission spectrum of the device.

An exemplary embodiment of the invention is described below. At least one embodiment comprises a light emitting device with predominantly green emission, and a secondary blue emission, coupled with down conversion layers having complementing light converting materials to obtain good color rendering. An example of such a predominantly green and secondarily blue emission spectrum is shown in FIG. 2. Such an embodiment can be realized through a vertical stack structure where two emitting layers, a blue emitting layer and a green emitting layer, are disposed within the organic stack of the OLED device (see below). Alternatively, such an apparatus can be realized through printing or patterning, where regions of blue and green OLEDs are printed on a substrate, the ratio of which is designed to optimize the efficiency. The emitters used in the OLED emissive layers for either of these embodiments can be any combination of phosphorescent or fluorescent emitting components. A preferred blue-green emission spectrum of the emitting layers of such a device is illustrated in FIG. 3. A predominant or primary emission with a peak at a wavelength around 500 nm is representative of a green emission which is utilized in at least one exemplary embodiment of the invention. Other green emission spectrums with different peak wavelengths can also be utilized in one or more embodiments of the invention. Likewise, a secondary emission with a peak of around 470 nm is representative of a blue emission which is utilized in the invention. The spectrums shown are merely exemplary and intended to limit the choice of emission spectrums produce or desired.

Figure 4:
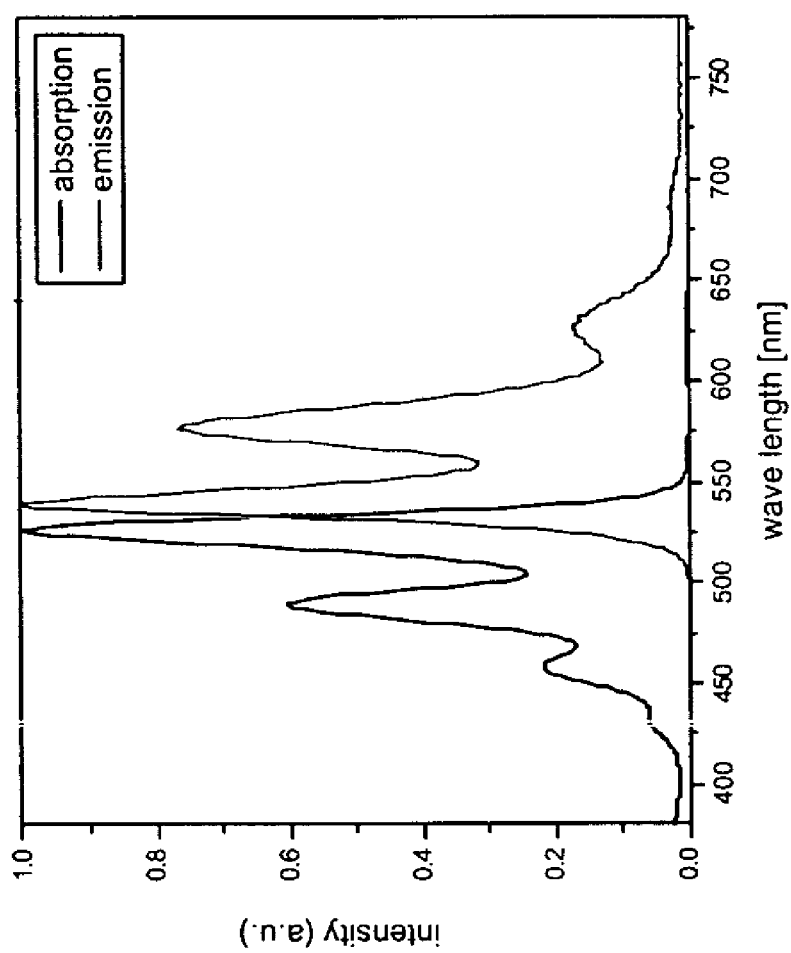
FIG. 4 shows the absorption and emission spectra of the dyes.
Figure 5:
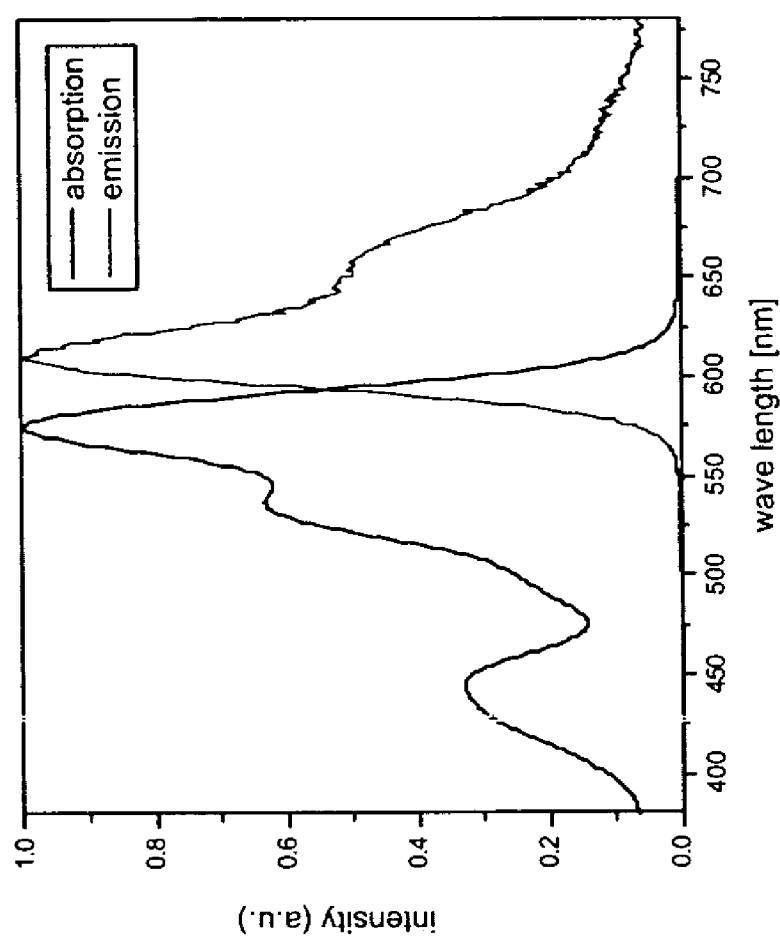
FIG. 5 shows the normalized absorption and emission spectra of the dyes.

A preferred embodiment of down conversion layers used in such and other embodiments of the invention is illustrated below. The example uses organic fluorescent dyes for the down conversion layers but the invention can use any type of down conversion layer and is not limited to organic fluorescent dyes. Two organic fluorescent dyes (labeled as dye 1 and dye 2 in the FIGS. 4 and 5) are each dissolved in transparent matrix materials (1 and 2) (for example PMMA (polymethylmethacrylate), silicone, polycarbonate, and/or epoxy). Conversion medium 1 (dye 1 and transparent matrix 1) and conversion medium 2 (dye 2 and transparent matrix 2) are formed in this manner. FIG. 4 and FIG. 5 show the absorption and emission spectra of the dyes 1 and 2, respectively. In essence, dye 1 and dye 2 both absorb light in the green range of the visible spectrum. Dye 1 emits orange light and dye 2 emits red light.

Figure 6:
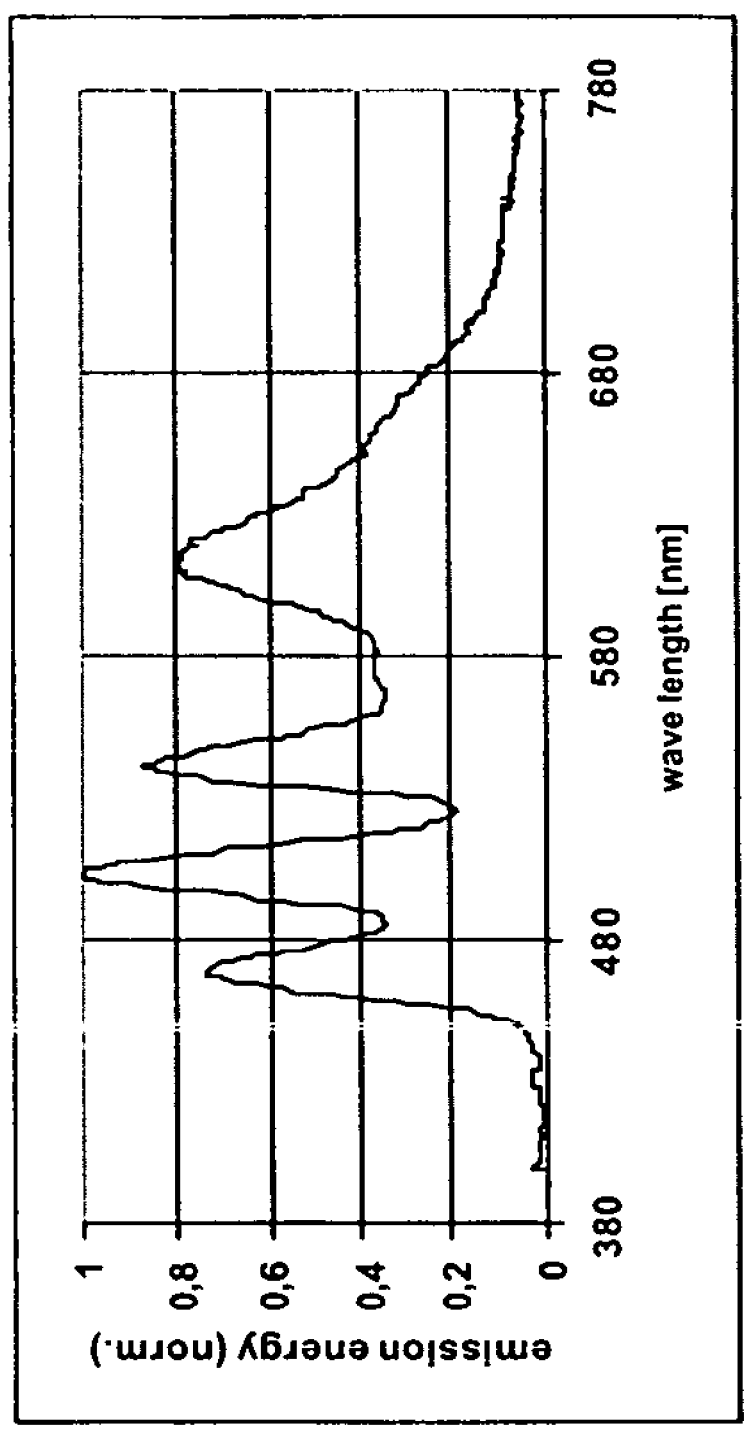
FIG. 6 illustrates the output spectrum of the coated device.

A layer of conversion medium 1 is applied on the light emitting side of the OLED device (for example by means of doctor blade technique). After curing the conversion medium 1 layer, a layer of conversion medium 2 is applied on top of the conversion medium 1 layer. Given an appropriate choice of thickness values for these layers, an output spectrum of the coated device can be exemplified by that shown in FIG. 6. The spectrum shown in FIG. 6 is related to a color rendering index (CRI) of greater than 80.

In terms of efficiency, for example, if the green phosphorescent material in the green OLED has an efficiency of 30 lumens/watt and the blue phosphorescent material in the blue OLED has an efficiency of 6 lumens/watt, the down converted device has been shown to have an efficiency of 15 lumens/watt and a CRI of 84. Thus, enhancement of light extraction in accordance with the invention has been shown to lead to an additional 50% increase in efficiency. The calculations for this device design are based on the down-conversion model described in the publication "Organic light-emitting devices for illumination quality white light", Anil R. Duggal, J. J. Shiang, Christian M. Heller and Donald F. Foust, Applied Physics Letters, Volume 80, Number 19, page 3470-3472, 2002).

Some potential advantages of a down-converted OLED device in accordance with the invention include: 1) a higher quantum efficiency than a blue OLED; 2) ease of processing compared to a RGB-OLED and 3) no red emitting components in the active electroluminescent layer(s) of the device and, hence less trapping effects when compared to a RGB-OLED.

Figure 7:
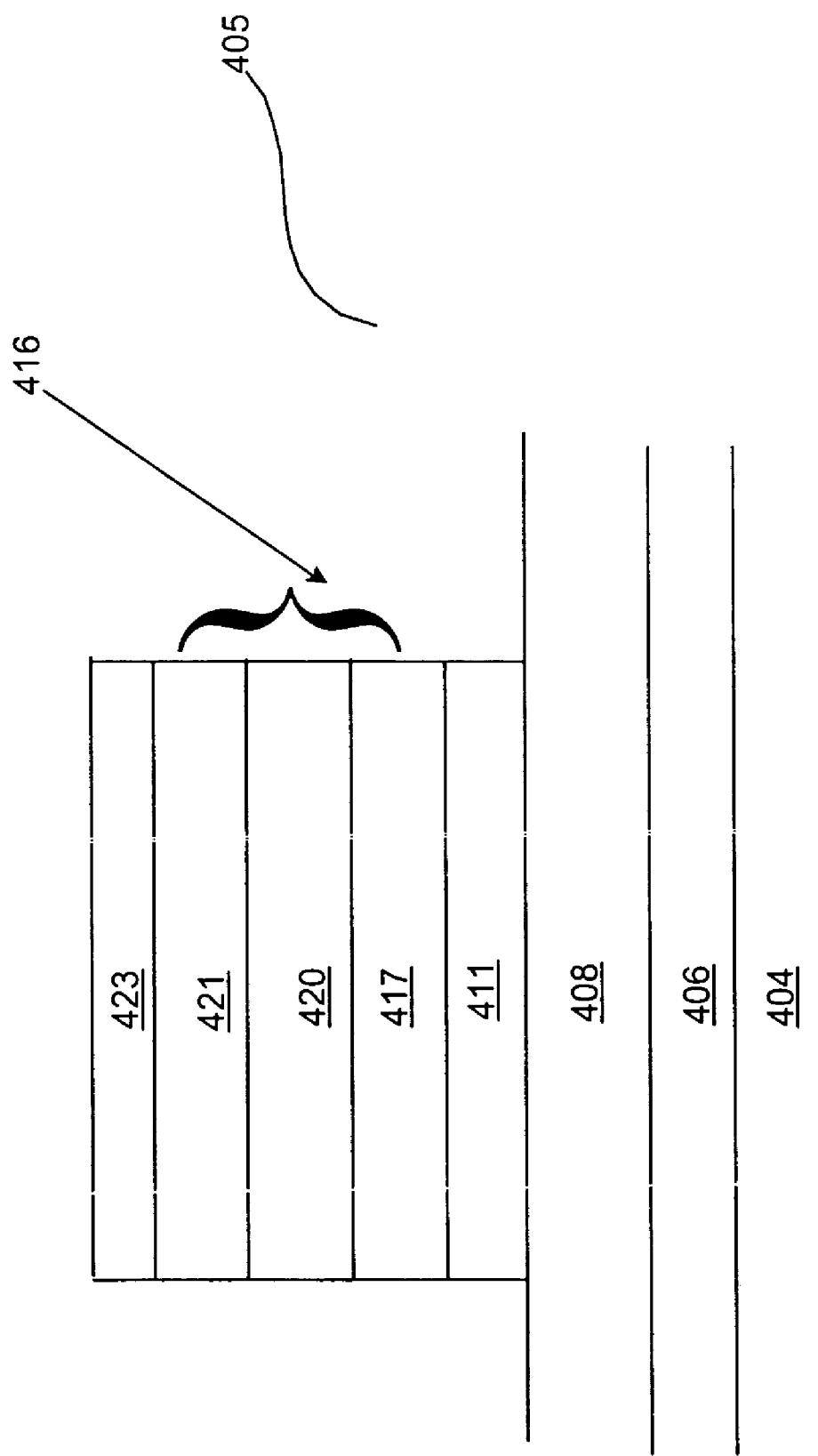
FIG. 7 illustrates a cross-section of an OLED device accordance with at least one embodiment of the invention.

FIG. 7 illustrates a cross-section of an electroluminescent apparatus in accordance with at least one embodiment of the invention. As shown in FIG. 7, the organic light emitting diode (OLED) device 405 includes a first electrode 411 on a substrate 408. As used within the specification and the claims, the term "on", "over", "above" includes layers that are in physical contact (adjacent) and layers that are separated by one or more intervening layers, or air or other substances. The first electrode 411 may be patterned for pixilated applications or unpatterned for backlight applications. A photo-resist material may be deposited on the first electrode 411 and patterned to form a bank structure (not pictured) having an aperture that exposes the first electrode 411. The aperture may be a pocket (e.g., a pixel of an OLED display) or a line.

One or more organic materials is deposited onto the first electrode 411 (and into the aperture, if available) to form one or more organic layers of an organic stack 416. One or more of the layers (films) comprising organic stack 416 are, in accordance with the invention, cross-linked to become insoluble. The organic stack 416 is disposed above the first electrode 411. The organic stack 416 includes a hole transport layer (HTL) 417 and two emissive layers 420, 421 and 422. If the first electrode 411 is an anode, then the HTL 417 is on the first electrode 411. Alternatively, if the first electrode 411 is a cathode, then the second emissive layer 421 is on the first electrode 411. The OLED device 405 also includes a second electrode 423 (which is either a cathode or anode depending upon the first electrode 411) disposed upon the organic stack 416. In accordance with the invention, at least one down conversion layer is fabricated on the exterior of the light emitting side of the OLED device 405. In the case of a bottom emitting OLED, this would be on the exterior of the cathode.

As shown in various other embodiments, adding additional layers may be desirable in order to improve performance of devices and may include functionalities such as hole transport, electron transport, hole blocking, optical confinement etc. In accordance with the some embodiments of the invention, both a hole blocking and electron blocking layers accompany three emissive layers.

In addition a layer made of a single material may be able to provide more than one functionality, for example the same layer may provide hole transport, electron blocking and optical waveguiding. The layers shown in FIG. 1 and FIG. 2, in accordance with the invention, are described in greater detail below.

Substrate 408

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching components built in to control the operation of the device.

First electrode 411

In one configuration, the first electrode 411 functions as an anode. The anode is a conductive layer which serves as a hole-injecting layer and which typically comprises a material with work function greater than about 4.5 eV. Typical anode materials include metals (such as platinum, gold, palladium, and the likes); metal oxides (such as lead oxide, tin oxide, ITO (indium tin-oxide), and the likes); graphite; doped inorganic semiconductors (such as silicon, germanium, gallium arsenide, and the likes); and doped conducting polymers (such as polyaniline, polypyrrole, polythiophene, and the likes).

For OLEDs, the first electrode layer 411 is usually thin enough so as to be semi-transparent and allow at least a fraction of light to transmit through (in bottom emitting OLEDs). The thickness of the first electrode 411 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern upon the first electrode 411.

In accordance with the invention, the top exposed surface of first electrode 411 might become the deposition surface upon which the organic solution for the first emissive layer 420. In an alternative configuration, the first electrode layer 411 functions as a cathode (the cathode is a conductive layer which serves as an electron-injecting layer and which comprises a material with a low work function). The cathode, rather than the anode, is deposited on the substrate 408 in the case of, for example, a top-emitting OLED. Typical cathode materials are listed below in the section for the "second electrode 423". In cases where the first electrode is a cathode, the second emissive layer 421 would be deposited/fabricated thereon.

First Emissive Layer 420

First emissive layer 420 can include one or more components processed into film. Preferably, at least some part of the first emissive layer 420 is a polymer or similar organic-based film, thought the layer 420 may also have inorganic components.

The first emissive layer 420 contains at least one organic component that is capable of emitting light when activated in a first spectrum. Such components generally fall into two categories. The first category of OLEDS, referred to as polymeric light emitting diodes, or PLEDs, utilize components such as polymers in the first emissive layer 420. The polymers may be organic or organometallic in nature. As used herein, the term organic also includes organometallic materials. Devices utilizing polymeric components in first emissive layer 420 are especially preferred.

The first emissive component is one or more electroluminescent ("EL") polymers that emit light. The first emissive component can consist of, for example, conjugated EL polymers, such as polyfluorenes, polythiophenes, polyphenylenes, polythiophenevinylenes, or poly-p-phenylenevinylenes or their families, copolymers, derivatives, or mixtures thereof.

In accordance with the invention, the first emissive layer may also contain at least one non-emissive component. Non-emissive components may include, for instance, interlayer functionality such as hole transport. The first emissive component and non-emissive component can be blended physically; chemically reacted, cross-linked or otherwise bonded or doped with one another. The first emissive layer can be deposited via spin coating, inkjet printing or other deposition techniques. The first emissive component can be, for example, any class or type of EL conjugated polymers, such as polyfluorenes; poly-p-phenylenevinylenes that emit white, red, blue, yellow, or green light and are 2-, or 2, 5-substituted poly-p-pheneylenevinylenes; polyspiro polymers; or their families, copolymers, derivatives, or mixtures thereof.

As an alternative to polymers, the first emissive layer 420 can be formed using small molecule materials as well. Unlike polymeric materials that are applied as solutions or suspensions, small-molecule light emitting materials are preferably deposited through evaporative, sublimation, or organic vapor phase deposition methods. There are also small molecule materials that can be applied by solution methods too. Combinations of polymer materials and smaller organic molecules can also serve as active electronic layer. For example, a PLED may be chemically derivatized with a small organic molecule or simply mixed with a small organic molecule to form EML 420. Examples of electroluminescent small molecule materials include tris(8-hydroxyquinolate) aluminum ($Alq_3$), anthracene, rubrene, tris(2-phenylpyridine) iridium ($Ir(ppy)_3$), triazine, any metal-chelate compounds and derivatives of any of these materials.

In addition to polymers, organic monomers or oligomers that emit by fluorescence or by phosphorescence can serve as an emissive component residing in first emissive layer 420, if blended with a polymer containing cross-linkable groups. Combinations of polymeric and smaller organic molecules can also serve as the emissive component in first emissive layer 420. For example, an emissive component may be chemically derivatized with a small organic molecule or simply mixed with a small organic molecule in forming first emissive layer 420.

In addition to active electronic materials that emit light, first emissive layer 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used.

In some embodiments of the invention, the first emissive layer 420 has only one emissive component. Likewise, in some embodiments of the invention, the first emissive layer 420 may have only one non-emissive component, however, in alternate embodiments it may have several non-emissive components. In yet other embodiments, the first emissive layer 420 can be composed of a non-emissive conjugated polymer doped with an emissive monomer or an oligomer.

Second Emissive Layer 421

The second emissive layer 421 may be composed of components similar in structure and composition to that described above for first emissive layer 420. Thus, each of the components comprising second emissive layer 421 may be at least one or more of a polymer, polymer blend, monomer, oligomer, co-polymer, an organic side-group, small molecule or blend of any of these.

The second emissive layer 421 is capable of emitting light of a different distinct color to that of the first emissive layer 420. The light emission from the second emissive layer is a second spectrum (which may consist of more than one different color spectra combined). The second emissive layer 421 is fabricated using a solvent such that the second emissive layer 421 does not degrade or dissolve in the solvent used in fabricating the first emissive layer 420 and vice-versa. Alternatively, the first emissive layer 420 can be cross-linked to render it insoluble to the solvent used in fabricating the second emissive layer 421.

In accordance with at least one embodiment of the invention, the first emissive layer 420 and second emissive layer 421 would combine to produce a bluish-green output spectrum similar to that shown in FIG. 2, for example. This may be achieved by first emissive layer 420 emitting in blue (first spectrum of blue) and by the second emissive layer 421 emitting in green (second spectrum of green). In other embodiments, this may be achieved by first emissive layer 420 emitting in green (first spectrum of green) and by the second emissive layer 421 emitting in blue (second spectrum of blue).

HTL 417

The HTL (Hole Transporting Layer) 417 typically has a much higher conductivity than the subsequent organic layers and serves several purposes as outlined below: (1) a buffer to provide a good bond to the substrate; and/or (2) a hole injection layer to promote hole injection; and/or (3) a hole transport layer to promote hole transport. In accordance with the invention, HTL 417 may also act as an electron blocking layer.

The HTL 417 can be formed by deposition of an organic solution, polymers, monomers, side-groups, inorganic materials, dopants and/or small molecule materials. For example, the HTL 417 can be made of tertiary amine or carbazole derivatives both in their small molecule or their polymer form, or organic solutions such as conducting polyaniline ("PANI"), or preferably, solutions of "PEDOT:PSS." A PEDOT:PSS solution is comprised of water, polyethylenedioxythiophene ("PEDOT"), and polystyrenesulfonic acid ("PSS") (this solution is referred to, herein, as a PEDOT:PSS solution and may be combined with or contain other components as well. The HTL 417 has a thickness from about 5 nm to about 1000 nm, preferably from about 20 nm to about 500 nm, and more preferably from about 50 to about 250 nm.

The HTL 417 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. The hole transporting material is deposited on the first electrode 411 and then dried into a film. The dried material represents the HTL 417.

Second Electrode 423

In one embodiment, second electrode 423 functions as a cathode when an electric potential is applied across the first electrode 411 and second electrode 423. In this embodiment, when an electric potential is applied across the first electrode 411, which serves as the anode, and second electrode 423, which serves as the cathode, photons are emitted from the first emissive layer 420 and the second emissive layer 421.

While many materials, which can function as a cathode, are known to those of skill in the art, most preferably a composition that includes aluminum, indium, silver, gold, magnesium, calcium, lithium, lithium fluoride, cesium fluoride sodium fluoride, and barium, or combinations thereof, or alloys thereof, is utilized. Aluminum, and combinations of calcium and aluminum, barium and aluminum, lithium fluoride and aluminum, lithium fluoride with calcium and aluminum, magnesium and silver or their alloys are especially preferred.

Preferably, the thickness of second electrode 423 is from about 10 nm to about 1000 nm, more preferably from about 50 nm to about 500 nm, and most preferably from about 100 nm to about 300 nm. While many methods are known to those of ordinary skill in the art by which the first electrode material may be deposited, vacuum deposition methods, such as thermal vacuum evaporation, sputtering or electron-beam deposition are preferred. Other layers (not shown) such as a barrier layer and getter layer may also be used to protect the electronic device. Such layers are well-known in the art and are not specifically discussed herein.

First Down Conversion Layer 406 and Second Down Conversion Layer 404

In accordance with the invention, one or more down conversion layers are fabricated outside of the device 405 on the light emitting side of device 405. In the case of a bottom emitting OLED, the down conversion layer(s) would be fabricated over the substrate. FIG. 4 illustrates a first and second down conversion layers 406 and 404, for example. The function of the down conversion layers 406 and 404 is absorb one part of the spectrum emitted by device 405 and emit light in another different spectrum. Both of the down conversion layers 406 and 404, for example, absorb green light (in the case of the OLED device 405 emitting a bluish-green spectrum). In the same example, the first down conversion layer 406 would emit in the orange spectrum while the second down conversion 404 would emit in the red spectrum. In other embodiments instead, the first down conversion layer 406 emits in the red spectrum while the second down conversion 404 emits in the orange spectrum. In still other embodiments, yellow emitting down conversion layers can be used as a replacement for or in addition to either red and/or orange emitting down conversion layers. The down conversion layers 406 and 404 can be fabricated using a dye such as, for example, an organic fluorescent dye (for example perylene and coumarin). Other exemplary down converting materials which could be used in forming the down conversion layer(s) include, but are not limited to, cerium doped garnets, nitride phosphors, ionic phosphors like $SrGa_2S_4:Eu^{2+}$ or $SrS:Eu^{2+}$, quantum dots or conjugated polymers. The dye(s) or down converting materials in each case can be dissolved or blended into transparent matrix materials such as silicone, epoxy, adhesives, polymethylmethacrylate, polycarbonate and so on.

The first down conversion layer 406 can be applied as a coating over the substrate by spin coating, spray coating, dipping, doctor blading or similar technique. The second down conversion layer 404 would be disposed on the first down conversion layer 406. To accomplish this, first down conversion layer 406 could be cured or rendered insoluble (for example, by cross-linking) if not already so. The down conversion layers can also be cross-linked if needed or desired. After cross-linking, the first down conversion layer, it can not be degraded (or dissolved) when fabricating the second down conversion layer for example. The second down conversion layer 404 can also be non-selectively deposited by spin coating, spray coating, dipping doctor blading, etc.

In at least one embodiment, the preferred thickness of each the down conversion layers 406 and 404 is from about 200 nm to about several millimeters, and more preferably, is about 1 μm to 500 μm. The down conversion layers can be as thick or thin as needed or desired, without particular limitation.

Figure 9:
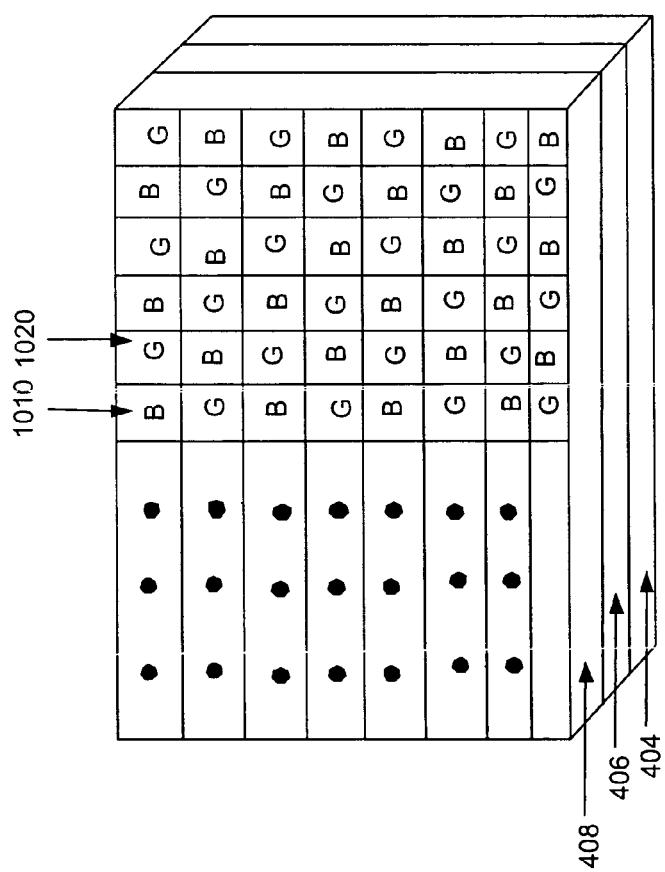
FIG. 9 illustrates a blue-green patterned OLED display in accordance with one or more embodiments of the invention.

FIG. 9 illustrates a cross-section of an electroluminescent apparatus in accordance with at least one embodiment of the invention. The device 905 is identical and similar in all respects to device 405, particularly with respect to like numbered elements having a like description, except as follows. The device 905 has an organic stack 916 which only has one emissive layer 920 as opposed to two emissive layers.

Emissive Layer 920

Emissive layer 920 may be composed of components similar in structure and composition to that described above for first emissive layer 420. However, emissive layer 920 emits in a combined spectrum of both blue and green and may contain two or more emissive components to achieve this combined output spectrum. Thus, each of the components comprising emissive layer 920 may be at least one or more of a polymer, polymer blend, monomer, oligomer, co-polymer, an organic side-group, small molecule or blend of any of these. So, for instance, the second emissive layer may consist of a blend of two emissive polymers, an emissive polymer doped with an emissive small molecule or a co-polymer with a plurality of emissive chromophores incorporated on the polymer chain or as pendant groups. The relative concentration of blue emissive components and green emissive components can be designed to produce a desirable emission spectrum such as that shown in FIG. 2.

Single Down Conversion Layer

In some embodiments of the invention, it may be possible to use only one dye, such that the single down conversion layer while absorbing the spectrum of the OLED device, only emits in a single spectrum such as red, yellow or orange. In still other embodiments of the invention, the two or more conversion layers can be combined into a single conversion layer. A single down conversion layer can be used in conjunction with a single emissive layer in some embodiments and with two emissive layers in yet other embodiments. A single down conversion layer may blend one or more dyes, phosphors etc, or comprise a single dye emitting in one spectrum with dopants emitting in another spectrum.

All of the organic or polymer layers, down conversion layers and emissive layers mentioned above can be fabricated from a solution by ink-jet printing or spun coating or otherwise deposited. The solution used may be any "fluid" or deformable mass capable of flowing under pressure and may include solutions, inks, pastes, emulsions, dispersions and so on. The solution may also contain or be supplemented by further substances or solvents and the like which affect viscosity, contact angle, thickening, affinity, drying, dilution and so on of the deposited solution.

Often other steps such as washing and neutralization of films, the addition of masks and photo-resists may precede the cathode deposition. However, these are not specifically enumerated as they do not relate specifically to the novel aspects of the invention. Other steps (not shown) like adding metal lines to connect the anode lines to power sources may also be included in the workflow. Also, for instance, after the OLED is fabricated it is often encapsulated to protect the layers from environmental damage or exposure. Such other processing steps are well-known in the art and are not a subject of the invention.

Figure 8:
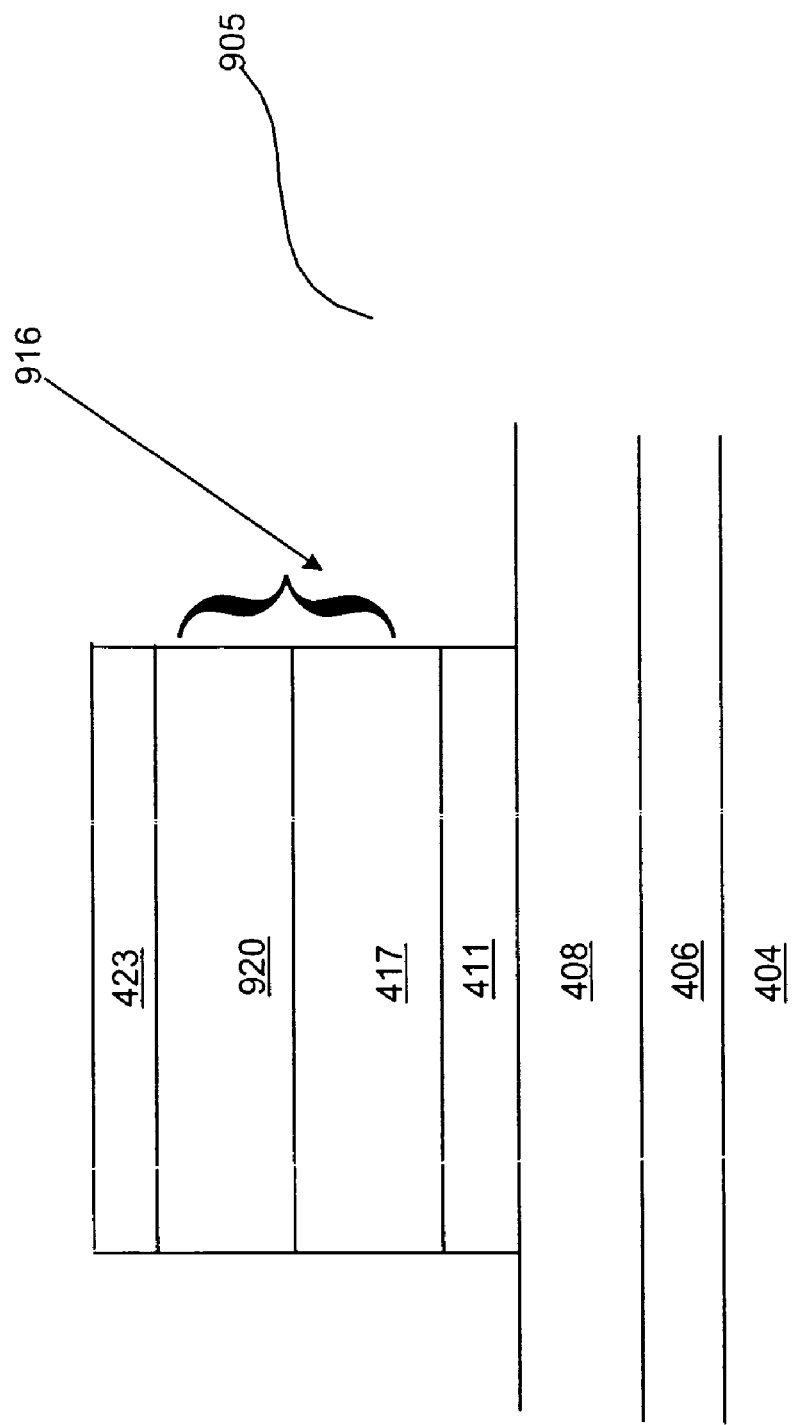
FIG. 8 illustrates a cross-section of an OLED device in accordance with at least one embodiment of the invention.

FIG. 9 illustrates a blue-green patterned electroluminescent apparatus in accordance with one or more embodiments of the invention. In alternate embodiments of the invention, the blue and green emissions can be provided by an alternating pattern of blue and green single emissive layer OLEDs fabricated upon a substrate. One or more down conversion layers in accordance with the invention can be fabricated on the outside of the substrate to cover the entire pattern of blue and green OLEDS. For example, a single emissive layer OLED 1010 is shown which emits only in the blue spectrum. In an adjacent column and built upon the same substrate 408 is another single emissive layer OLED 1020 which emits in the green spectrum. The alternating pattern of blue and green OLEDs will combine to produce a bluish-green spectrum over an area. Such an arrangement is useful for area lighting applications. The down conversion layers 406 and 404 are fabricated on outer surface of the substrate 408 and serve to down convert the blue and green spectra emitted by the pattern of OLEDS. The down conversion layers 406 and 404 and substrate 408 are discussed above with respect to FIG. 8. The OLEDs 1010 and 1020 are single emissive layer OLEDs with other layers (not shown) similar to that shown for OLED device 405 of FIG. 8. The concentration of blue versus green OLEDs shown is merely exemplary. In some embodiments of the invention, the ratio of blue OLEDs to green OLEDs can be optimized to achieve the highest possible optical efficiency, the best CRI, and so on. This ratio may refer to the quantities of OLEDs, the intensities of the OLEDs, the area utilized by the OLEDs or the driving times of the OLEDs.

In still other embodiments of the invention, the OLED device can be green emitting without any or any significant blue emission. Such a device can be coupled with one ore more down conversion layers emitting in red, orange, and/or yellow and absorbing part of the green spectrum. The resulting output spectrum would be between green and orange, for example, and may produce a high efficiency orange illumination apparatus.

The OLED display/device described earlier can be used within displays in applications such as, for example, area, industrial and residential lighting, back lighting, computer displays, information displays in vehicles, television monitors, telephones, printers, and illuminated signs.

What is claimed is:

1. An electroluminescent apparatus comprising:
   an organic light emitting diode (OLED) device emitting light in the blue and green spectrums, the OLED device comprising a first emitting layer and a second emitting layer, said second emitting layer emitting light that is a different color than light emitted from the first emitting layer; and
   at least one down conversion layer, said at least one down conversion layer absorbing at least part of the green spectrum light and emitting light in at least one of a yellow spectrum, an orange spectrum, and a red spectrum, said at least one down conversion layer fabricated on the exterior of the light emitting side of said OLED device.

2. The apparatus of claim 1 wherein said at least down conversion layer comprises a first down conversion layer emitting in the orange spectrum and a second down conversion layer emitting in the red spectrum.

3. The apparatus of claim 1 wherein said at least one down conversion layer comprises of at least one dye.

4. The apparatus of claim 3 wherein said dye is fluorescent.

5. The apparatus of claim 3 wherein said dye is organic.

6. The apparatus of claim 1 wherein said at least down conversion layer comprises a transparent matrix material.

7. The apparatus of claim 6 wherein said transparent matrix material is at least one of silicone, epoxy, polymethylmethacrylate and polycarbonate.

8. The apparatus of claim 1 wherein said OLED device comprises:
   a first emissive layer capable of emitting in the green spectrum; and
   a second emissive layer capable of emitting in the blue spectrum.

9. The apparatus of claim 1 wherein said OLED device comprises:
   a single emissive layer capable of emitting in both blue and green spectra.

10. The apparatus of claim 8 wherein said first and second emissive layers are polymer layers.

11. The apparatus of claim 9 wherein said single emissive layer is a polymer layer.

12. The apparatus of claim 2 wherein said first and second down conversion layers have a thickness of from about 200 nm to about several millimeters.

13. The apparatus of claim 1 wherein said at least one down conversion layer comprises a single down conversion layer.

14. The apparatus of claim 2 wherein said first and second down conversion layers have a thickness of from about 1 micrometer to about 500 micrometers.

15. The apparatus of claim 1 wherein said apparatus is used in a lighting application.

16. The apparatus of claim 1 wherein said apparatus has a combined output spectrum of nearly white.

17. The apparatus of claim 1 wherein said at least one down conversion layer comprises at least one of perylene, coumarin, cerium doped garnets, nitride phosphors, ionic phosphors, fluorescent dyes, quantum dots and conjugated polymers.

18. An electroluminescent apparatus comprising:
a plurality of single layer organic light emitting diode (OLED) devices fabricated upon a common substrate, wherein a first portion of said plurality of OLED devices emits light in a green spectrum and a second portion of said plurality of OLED devices emits light in a blue spectrum; and
at least one down conversion layer, said at least one down conversion layer absorbing at least part of the green spectrum light and emitting light in at least one of an orange spectrum, a yellow spectrum, and a red spectrum, said at least one down conversion layer fabricated on the exterior of the light emitting side of said OLED devices.

19. The apparatus of claim 18 wherein said at least down conversion layer comprises a first down conversion layer emitting in the orange spectrum and a second down conversion layer emitting in the red spectrum.

20. The apparatus of claim 18 wherein said at least one down conversion layer comprises at least one dye.

21. The apparatus of claim 20 wherein said dye is fluorescent.

22. The apparatus of claim 20 wherein said dye is organic.

23. The apparatus of claim 18 wherein said at least down conversion layer comprises a transparent matrix material.

24. The apparatus of claim 23 wherein said transparent matrix material is at least one of silicone, epoxy, PMMA and PC.

25. The apparatus of claim 19 wherein said first and second down conversion layers have a thickness of from about 200 nm to about several millimeters.

26. The apparatus of claim 18 wherein said at least one down conversion layer comprises a single down conversion layer.

27. The apparatus of claim 19 wherein said first and second down conversion layers have a thickness of from about 1 micrometer to about 500 micrometers.

28. The apparatus of claim 18 wherein said apparatus is used in a lighting application.

29. The apparatus of claim 18 wherein said apparatus has a combined output spectrum of nearly white.

30. The apparatus of claim 18 wherein said at least one down conversion layer comprises at least one of perylene, coumarin, cerium doped garnets, nitride phosphors, ionic phosphors, fluorescent dyes, quantum dots and conjugated polymers.

31. An electroluminescent apparatus comprising:
an organic light emitting diode (OLED) device emitting light in the blue and green spectrums; and
at least a first down conversion layer and a second down conversion layer, said first and second down conversion layers absorbing at least part of the green spectrum light and emitting in at least one of a yellow spectrum, an orange spectrum, and a red spectrum, said second down conversion layer emitting light that is a different color than light emitted from the first down conversion layer, said at least first and second down conversion layers fabricated on the exterior of the light emitting side of said OLED device.

32. The apparatus of claim 31 wherein said first and second down conversion layers each comprise at least one dye.

33. The apparatus of claim 32 wherein said dye is fluorescent.

34. The apparatus of claim 33 wherein said dye is organic.

35. The apparatus of claim 31 wherein said first and second down conversion layers each comprise a transparent matrix material.

36. The apparatus of claim 35 wherein said transparent matrix material is at least one of silicone, epoxy, polymethylmethacrylate and polycarbonate.

37. The apparatus of claim 31 wherein said OLED device comprises:
a first emissive layer capable of emitting in the green spectrum; and
a second emissive layer capable of emitting in the blue spectrum.

38. The apparatus of claim 31 wherein said OLED device comprises:
a single emissive layer capable of emitting in both blue and green spectra.

39. The apparatus of claim 38 wherein said first and second emissive layers are polymer layers.

40. The apparatus of claim 39 wherein said single emissive layer is a polymer layer.

41. The apparatus of claim 31 wherein said first and second down conversion layers have a thickness of from about 200 nm to about several millimeters.

42. The apparatus of claim 31 wherein said first and second down conversion layers have a thickness of from about 1 micrometer to about 500 micrometers.

43. The apparatus of claim 31 wherein said apparatus is used in a lighting application.

44. The apparatus of claim 31 wherein said apparatus has a combined output spectrum of nearly white.

45. The apparatus of claim 31 wherein said first and second down conversion layers each comprise at least one of perylene, coumarin, cerium doped garnets, nitride phosphors, ionic phosphors, fluorescent dyes, quantum dots and conjugated polymers.

* * * * *